(12) United States Patent
Tan et al.

(10) Patent No.: US 9,852,924 B1
(45) Date of Patent: Dec. 26, 2017

(54) LINE EDGE ROUGHNESS IMPROVEMENT WITH SIDEWALL SPUTTERING

(71) Applicant: Lam Research Corporation, Fremont, CA (US)

(72) Inventors: Zhongkui Tan, San Jose, CA (US); Hua Xiang, Pleasanton, CA (US); Yiting Zhang, Fremont, CA (US); Qian Fu, Pleasanton, CA (US); Qing Xu, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/246,239

(22) Filed: Aug. 24, 2016

(51) Int. Cl.
*H01L 21/3213* (2006.01)
*H01L 21/311* (2006.01)

(52) U.S. Cl.
CPC .. *H01L 21/32136* (2013.01); *H01L 21/31116* (2013.01); *H01L 21/31144* (2013.01)

(58) Field of Classification Search
None
See application file for complete search history.

(56) References Cited

U.S. PATENT DOCUMENTS

| | | | | |
|---|---|---|---|---|
| 5,384,009 A * | 1/1995 | Mak | | C23F 4/00 216/37 |
| 6,287,980 B1 * | 9/2001 | Hanazaki | | H01L 21/67069 156/345.28 |
| 6,326,307 B1 * | 12/2001 | Lindley | | H01L 21/31116 257/E21.252 |
| 6,432,318 B1 * | 8/2002 | Ding | | H01L 21/31116 216/67 |
| 6,833,325 B2 * | 12/2004 | Huang | | H01L 21/31116 257/E21.252 |
| 7,491,647 B2 * | 2/2009 | Sadjadi | | H01L 21/0273 257/E21.023 |
| 7,670,760 B2 * | 3/2010 | Shen | | G03F 7/168 430/330 |
| 8,124,322 B2 * | 2/2012 | Soda | | H01L 21/31116 430/313 |
| 8,187,865 B2 * | 5/2012 | Yun | | B81B 3/0021 422/68.1 |
| 8,298,958 B2 * | 10/2012 | Adams | | H01J 37/321 438/717 |
| 8,435,608 B1 * | 5/2013 | Subramonium | | C23C 16/045 427/569 |
| 8,673,785 B2 * | 3/2014 | Huang | | C23C 16/45561 216/37 |
| 8,753,804 B2 * | 6/2014 | Cheng | | H01L 21/0271 430/323 |
| 9,330,935 B2 * | 5/2016 | Hisamatsu | | H01L 21/0273 |
| 9,390,941 B2 * | 7/2016 | Watanabe | | G03F 7/40 |
| 2002/0134671 A1 * | 9/2002 | Demaray | | C23C 14/14 204/192.25 |

(Continued)

*Primary Examiner* — Allan Olsen
(74) *Attorney, Agent, or Firm* — Beyer Law Group LLP

(57) ABSTRACT

A method for reducing sidewall roughness in an etch layer below a first mask with sidewall roughness in a processing chamber is provided. Sidewalls of the first mask are smoothed, comprising, flowing a processing gas into the processing chamber and forming the processing gas into an in situ plasma in the processing chamber with sufficient energy to sputter and smooth sidewall roughness of the first patterned mask. The etch layer is etched through the first patterned mask.

18 Claims, 7 Drawing Sheets

(56) References Cited

U.S. PATENT DOCUMENTS

| | | | |
|---|---|---|---|
| 2005/0048787 A1* | 3/2005 | Negishi | H01L 21/0275 438/706 |
| 2007/0042607 A1* | 2/2007 | Sadjadi | G03F 7/40 438/715 |
| 2007/0048927 A1* | 3/2007 | Li | H01L 21/76224 438/218 |
| 2008/0182419 A1* | 7/2008 | Yasui | H01L 21/0273 438/710 |
| 2008/0230511 A1* | 9/2008 | Kim | H01L 21/0273 216/12 |
| 2011/0059616 A1* | 3/2011 | Narishige | H01L 21/0273 438/711 |
| 2014/0083975 A1* | 3/2014 | Yoshida | H01J 37/32091 216/41 |
| 2014/0272728 A1* | 9/2014 | Sinclair | G03F 7/00 430/327 |

\* cited by examiner

LINE EDGE ROUGHNESS IMPROVEMENT WITH SIDEWALL SPUTTERING

BACKGROUND

The disclosure relates to a method of forming semiconductor devices on a semiconductor wafer. More specifically, the disclosure relates to etching a dielectric layer in the formation of semiconductor devices.

In forming semiconductor devices, etch layers may be etched.

SUMMARY

To achieve the foregoing and in accordance with the purpose of the present disclosure, a method for reducing sidewall roughness in an etch layer below a first mask with sidewall roughness in a processing chamber is provided. Sidewalls of the first mask are smoothed, comprising, flowing a processing gas into the processing chamber and forming the processing gas into an in situ plasma in the processing chamber with sufficient energy to sputter and smooth sidewall roughness of the first patterned mask. The etch layer is etched through the first patterned mask.

These and other features of the present disclosure will be described in more detail below in the detailed description of embodiments and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present embodiments will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Line edge roughness (LER) and line width roughness (LWR) improvement in micro and nanofabrication is becoming increasingly urgent, especially in the semiconductor industry. As the feature sizes decrease, LER and LWR issues could easily cause device failure and yield loss. Lithography has limited contribution to improve LER due to the photoresist property and throughput concern. So plasma treatment and plasma etch has been used to improve LER and LWR.

Ion beam treatment of feature sidewall has been used for LER improvement. However, ion beam is expensive and time-consuming, so there is no commercial utilization for this technology.

Figure 1:
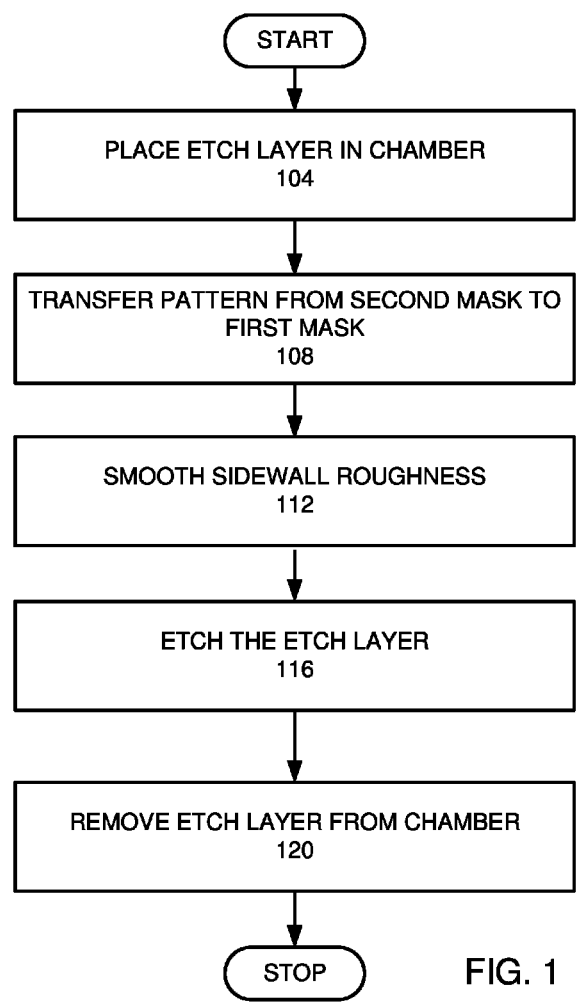
FIG. 1 is a high level flow chart of an embodiment.

FIG. 1 is a high level flow chart of an embodiment. In this embodiment, an etch layer is placed in a process chamber (step 104). A pattern is transferred from second mask to first mask, causing sidewall roughness in the first mask (step 108). The sidewall roughness of the first mask is smoothed using sidewall sputtering and sidewall deposition (step 112). An etch layer is etched through the first mask (step 116). The etch layer is removed from the process chamber (step 120).

EXAMPLE

Figure 2A:
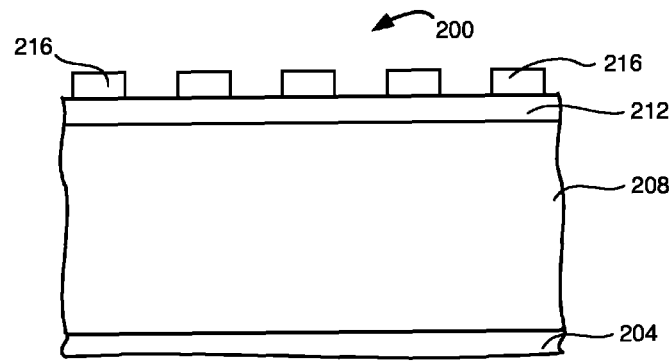
FIGS. 2A-C are schematic cross-sectional views of a stack processed according to an embodiment.

In a preferred embodiment, a substrate with a silicon oxide containing etch layer disposed under a first mask layer under a second mask layer is provided. FIG. 2A is a schematic cross-sectional view of a stack 200 with a substrate 204 with an etch layer 208, which in this example is a low-k dielectric etch layer comprising silicon oxide, disposed below a first mask layer 212 below a second mask layer 216. In this example, the second mask layer 216 is patterned.

Figure 3:
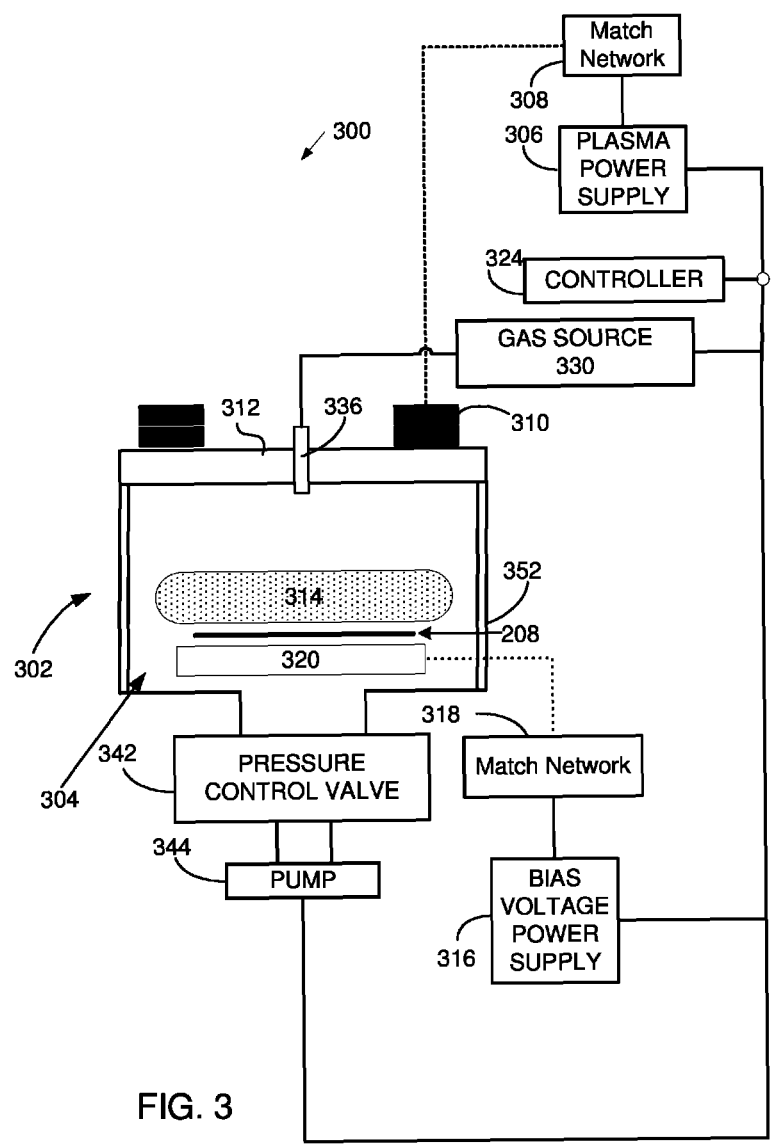
FIG. 3 is a schematic view of a etch chamber that may be used in an embodiment.

FIG. 3 schematically illustrates an example of a plasma processing system 300 which may be used to process the etch layer 208 in accordance with one embodiment of the present invention. The plasma processing system 300 includes a plasma reactor 302 having a plasma processing chamber 304, enclosed by a chamber wall 352. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304, while allowing energy to pass from the TCP coil 310 to the plasma processing chamber 304. A wafer bias voltage power supply 316 tuned by a match network 318 provides power to an electrode 320 to set the bias voltage on the etch layer 208 which is supported over the electrode 320. A controller 324 sets points for the plasma power supply 306 and the wafer bias voltage power supply 316.

The plasma power supply 306 and the wafer bias voltage power supply 316 may be configured to operate at specific radio frequencies such as, 13.56 MHz, 27 MHz, 2 MHz, 60 MHz, 400 kHz, or combinations thereof. Plasma power supply 306 and wafer bias voltage power supply 316 may be appropriately sized to supply a range of powers in order to achieve desired process performance. For example, in one embodiment of the present invention, the plasma power supply 306 may supply the power in a range of 50 to 5000 Watts, and the wafer bias voltage power supply 316 may supply a bias voltage of in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source/gas supply mechanism 330 provides gas to a gas feed 336 in the form of a nozzle. The process gases and byproducts are removed from the plasma processing chamber 304 via a pressure control valve 342 and a pump 344, which also serve to maintain a particular pressure within the plasma processing chamber 304. The gas source/gas supply mechanism 330 is controlled by the controller 324. A Kiyo by Lam Research Corp. of Fremont, Calif., may be used to practice an embodiment of the invention.

Figure 4:
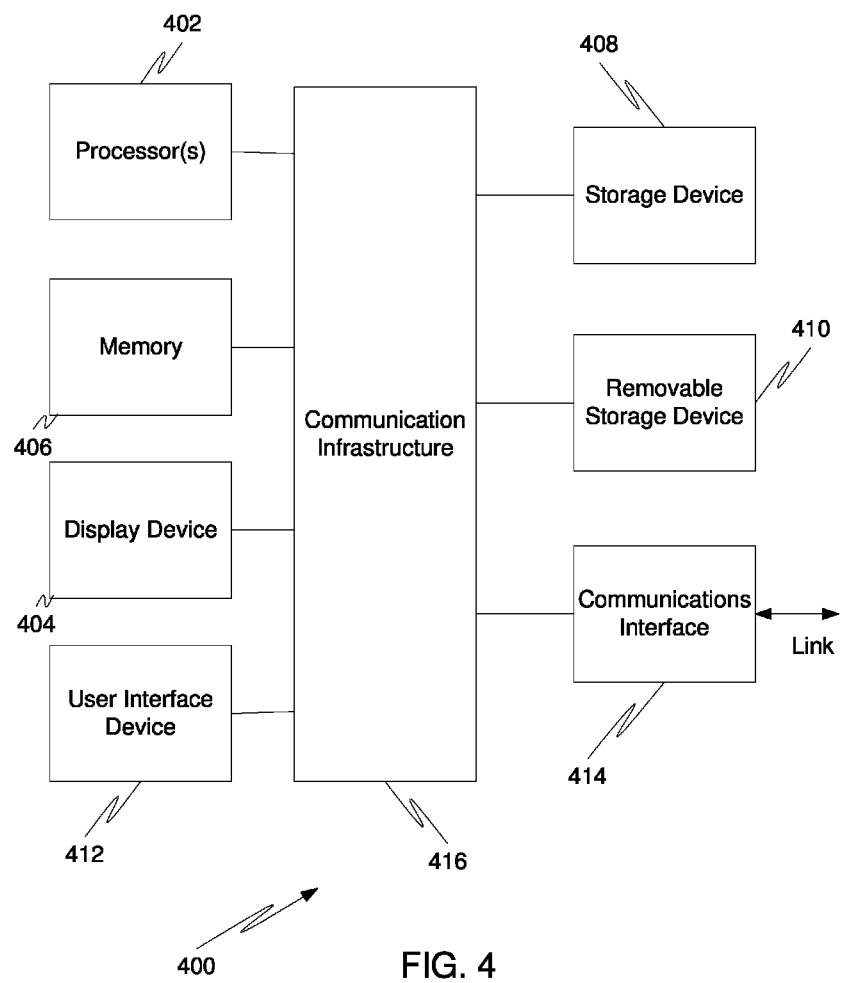
FIG. 4 is a schematic view of a computer system that may be used in practicing an embodiment.

FIG. 4 is a high level block diagram showing a computer system 400, which is suitable for implementing a controller 324 used in embodiments. The computer system may have many physical forms ranging from an integrated circuit, a printed circuit board, and a small handheld device, up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network, such as the Internet, in conjunction with remote processors that share a portion of the processing.

The term "non-transient computer readable medium" is used generally to refer to media such as main memory, secondary memory, removable storage, and storage devices such as hard disks, flash memory, disk drive memory, CD-ROM, and other forms of persistent memory, and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
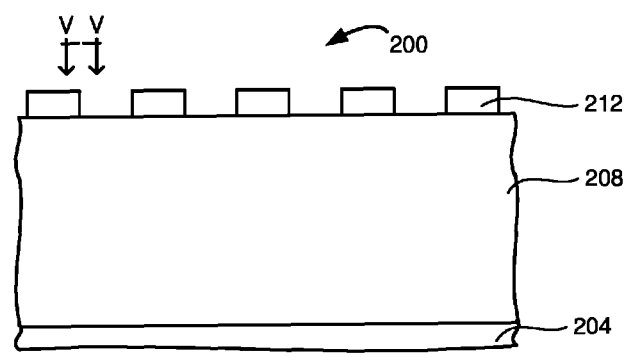
Figure 5A:
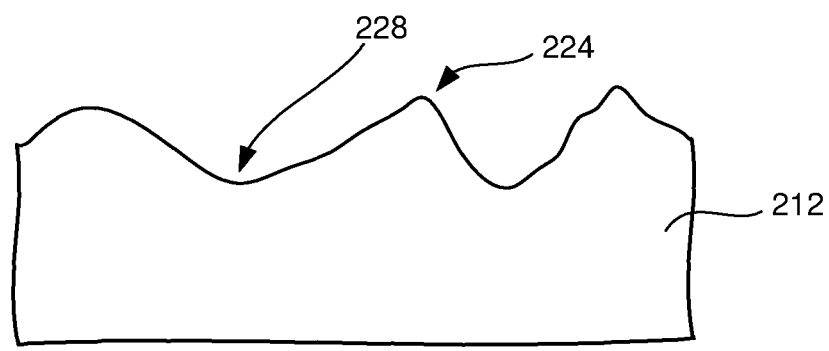
FIGS. 5A-B are schematic top views of a line edge.

After the etch layer 208 has been placed into the plasma processing system 300, a pattern is transferred from the second mask to the first mask, causing sidewall roughness in the first mask (step 108). In this example, where the silicon oxide containing etch layer 208 is a bulk silicon oxide based dielectric, the first mask layer 212 is a hardmask material, which in this example is SiON and the second mask layer 216 is photoresist. An example of a recipe for transferring the pattern from the photoresist second mask layer 216 to the SiON first mask layer 212 would flow 125 sccm $CF_4$, 18 sccm $O_2$, and 25 sccm $CHF_3$ into the plasma processing chamber 304. A pressure of 10 mTorr is maintained in the plasma processing chamber 304. A 480 W TCP input is provided to form the gas into a plasma. A bias of 50 volts is provided. The process is maintained for 49 seconds, and then the plasma is stopped by stopping the flow of gas. FIG. 2B is a cross-sectional view of the stack 200 after the pattern has been transferred from the second mask layer to the first mask layer 212. In this example the second mask layer is completely etched away. In other embodiments some of the second mask layer may remain. FIG. 5A is an enlarged schematic top view along view line V-V, shown in FIG. 2B, which shows the roughen sidewall of a patterned part of the first mask layer 212. The sidewall has convex portions 224 and concave portions 228.

Figure 6:
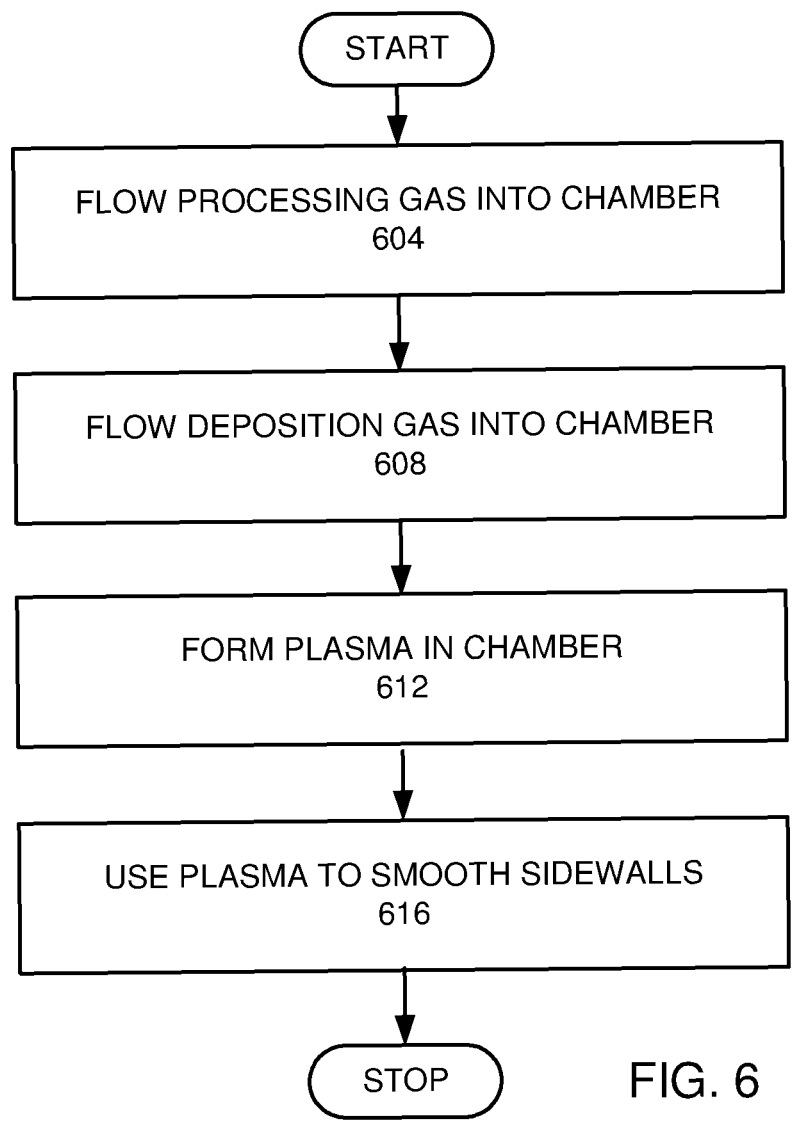
FIG. 6 is a more detailed flow chart of a step of smoothing sidewall roughness.

The sidewall roughness of the first mask is smoothed using sidewall sputtering and sidewall deposition (step 112). FIG. 6 is a more detailed flow chart of an embodiment of smoothing the sidewall roughness of the first mask using sidewall sputtering and sidewall deposition (step 112). A processing gas is flowed into the plasma processing chamber 304 (step 604). A deposition gas is flowed into the plasma processing chamber 304 (step 608). A plasma is formed in the plasma processing chamber 304 (step 612). The plasma is used to smooth the sidewalls (step 616).

Figure 5B:
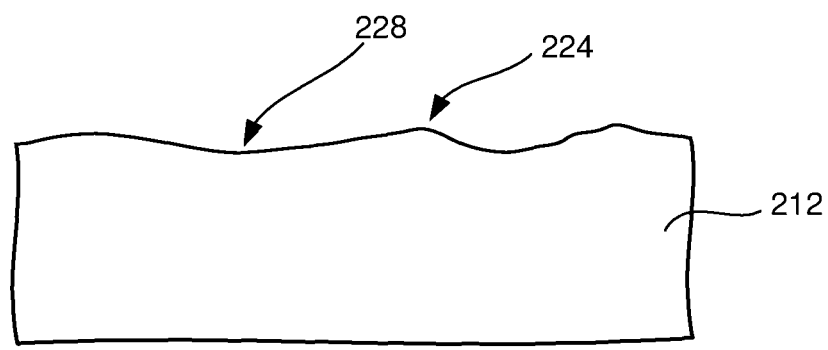

In this embodiment, the processing gas and the deposition gas are provided simultaneously. A recipe for this embodiment would be, providing a processing gas comprising 400 sccm He, which is flowed into the processing chamber 304 (step 604). A deposition gas of 20 sccm $N_2$ is flowed into the processing chamber 304 (step 608). The pressure is maintained at 400 mTorr. RF power is provided at 13.56 MHz with a power of 2600 Watts to form the processing gas and deposition gas into a plasma in the processing chamber 304 (step 612). A bias of 75 volts is provided by the electrode 320 so that ions from the processing gas are accelerated into the sidewalls of the first mask to cause sidewall sputtering. The process is maintained for 10 seconds. Then the flow of the processing gas and deposition gas may be stopped. FIG. 5B is an enlarged schematic top view of the sidewall of a patterned part of the first mask layer 212 after a smoothing process.

Figure 2C:
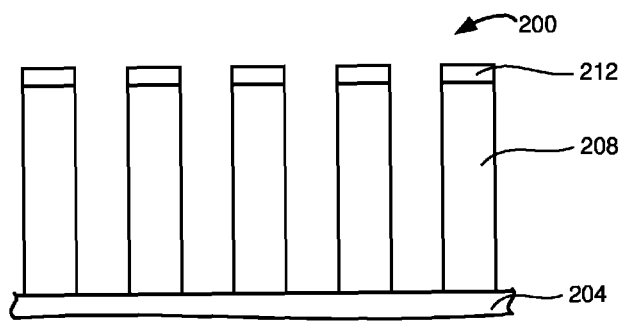

The etch layer is etched through the first mask (step 116). A conventional silicon oxide etch using a silicon nitride hardmask may be used to etch the etch layer. FIG. 2C is a cross-sectional view of the stack 200 after the etch layer 208 has been etched.

The etch layer is removed from the process chamber (step 120). One or more additional steps may be performed on the stack 200 before or after the etch layer is removed from the chamber.

Figure 7:
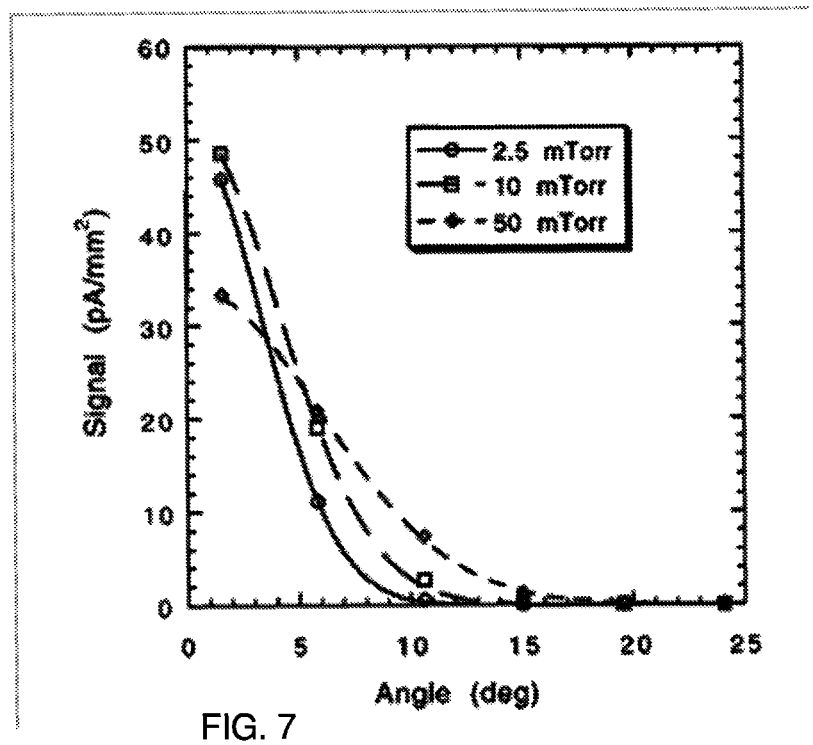
FIG. 7 is a graph of pressure versus angle of scatter.
Figure 8:
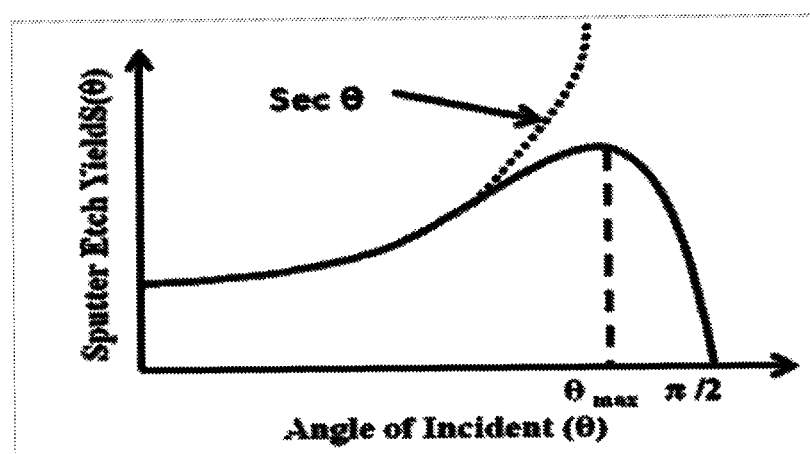
FIG. 8 is a graph of sputtering yield as a function of incident angle.

Without being bound by theory, due to the thermal energy of the plasma and scattering in the plasma and in the sheath in this embodiment, an ion angular distribution of at least 10% off-center is provided. The higher pressure, which is preferably above 50 mTorr, provides additional scattering. More preferably, the pressure is at least 80 mTorr to provide additional scattering. Most preferably, the pressure is at least 200 mTorr to provide additional scattering. These embodiments provide high intensity ions, which are significantly non-vertical, which cause such ions to sputter the sidewalls. FIG. 7 is a graph of pressure versus angle of scatter, which shows that as pressure increases, the angle of scatter increases. FIG. 8 is a graph of sputtering yield as a function of incident angle and that the target incident angle provides sufficient sputtering.

Without being bound by theory, it is believed the ions with an increased angle of scatter are more likely to strike the convex part of the LER and LWR. This would cause more of the convex part of the LER and LWR to be removed more than other parts of the LER and LWR. In addition, the deposition tends to deposit more on the concave parts of the LER and LWR, which provides further smoothing. In addition, sputter by-product materials have certain probability to be re-deposited on the wafer surface and feature sidewall, and this could play a major role in edge roughness improvement. The physical sputtering tends to smooth out any convex shape on the sidewall, and by-product deposition tends to fill in the concave shape on sidewall. So combining both sputtering and re-deposition will achieve further improvement in LWR and LER. Also, re-deposition behavior is well-controlled in a plasma process with pressure, gas flow, and plasma power.

This embodiment provides a simple approach in plasma etch, to direct ions to sidewalls of features for LER improvement. The embodiment has a similar mechanism as surface roughness improvement with physical sputtering and is generally good for hard mask materials instead of photoresist (PR). So the embodiment can serve as an extra LER/LWR improvement to a photoresist LER/LWR treatment step.

Various embodiments may be useful to current technology in all kinds of patterning applications in both memory and logic technology, which traditionally rely on lithography and PR treatment for LER/LWR improvement. Also, some embodiments could show a big impact to extreme ultra violet (EUV) lithography, because current PR treatment has very limited contribution to EUV LER/LWR improvement. So additional steps in plasma etch are needed to further improve EUV technology. The deposition may be used to maintain CD.

Other embodiments may use other mask materials for the first mask. Preferably, the first mask is of a hard mask material, such as $SiO_2$, SiN, SiON, Si, amorphous carbon, spin on carbon, metal, or metal oxide. Preferably, the first hard mask material is different from the material forming the etch layer, in order to facilitate selective etching. Forming the first mask of a hardmask material is preferred to maintain material integrity after sidewall sputtering. Since the sidewall sputtering is normally performed after the pattern transfer in various embodiments, the sidewalls may have plasma induced damage. Physical sputtering is a quantum effect with a certain threshold energy, which depends on material property, ion property, and incident angle. In some embodiments, the plasma damaged sidewall surface, caused by the pattern transfer, has a lower ion sputter threshold voltage (V1) than the bulk material threshold (V2). When embodiments apply voltage values between V1 and V2, the damage material is preferentially sputtered with respect to the bulk material, while reducing sidewall roughness.

In other embodiments, besides $SiO_2$, the etch layer may comprise silicon, SiN, SiON, carbon, W, TiN, $TiO_2$, WN, or WSi.

Preferably, during the sidewall sputtering, a bias of at least 15 volts is provided to accelerate ions to the substrate. More preferably, during the sidewall sputtering, a bias of at least 25 volts is provided.

In various embodiments, the process gas comprises a sputtering component comprising at least one of He, Ne, Ar, Kr, or Xe. The deposition gas comprises a deposition component comprising at least one of $N_2$, HBr, $H_2$, COS, $SO_2$, $CH_4$, $CH_xF_y$, or $C_xF_y$, where x and y are positive integers. In some embodiments, the deposition gas and processing gas may further comprise inert gases which do not physically or chemically react with the first mask.

In some embodiments, the second mask is formed by a double patterning process. Such a double patterning process would form a single patterned mask with a first resolution, and then form a double patterned mask, which uses the single patterned mask to have a second resolution, that may be double the first resolution. In one embodiment, a single photoresist patterned mask is formed and then an additional photoresist patterned mask is formed over the single photoresist patterned mask. A protective layer may be placed over the single photoresist patterned mask to protect the single photoresist patterned mask during the formation of the additional photoresist patterned mask. In another embodiment, a single photoresist mask may be used to pattern a hardmask. The single photoresist mask is removed and another photoresist mask is used to further pattern the hardmask in order to increase the frequency of the memory lines. The hardmask is then used as the second mask in the above embodiments for transferring a pattern to the first mask. The double mask process may be continued to form the double mask process into a triple or quadruple mask.

In some embodiments, the processing gas and deposition gas are provided sequentially, instead of simultaneously. In such a process, first the process gas is formed into a plasma to first sputter the sidewalls, and then the deposition gas is formed into a plasma to provide the deposition on the sidewalls. In such an embodiment, the process gas and deposition gas may be formed into a plasma separately. In another embodiment, the deposition may be performed before the sputtering by providing the deposition gas before the processing gas. In other embodiments, the processing gas and deposition gas are provided cyclically for a plurality of cycles. In such a cyclical process, during the deposition, the bias may be reduced, since during the deposition, ions are not accelerated to the sidewalls to cause sputtering.

In some embodiments, the sidewall smoothing may only comprise a sputtering. In such an embodiment a deposition gas is not provided.

Embodiments may be used for reducing sidewall roughness in forming features, such as lines and holes. Preferably, the sidewall roughness reduction may be in the formation of lines.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents that fall within the true spirit and scope of the present disclosure.

What is claimed is:

1. A method for reducing sidewall roughness in an etch layer below a first mask with sidewall roughness in a processing chamber, wherein a second mask is over the first mask, comprising:
   transferring a pattern from the second mask to the first mask forming a sidewall roughness in the first mask, wherein the first mask has a first sputter threshold voltage (V1) and wherein the transferring the pattern from the second mask to the first mask creates a damaged sidewall surface on the first mask, wherein the damaged sidewall surface has a second sputter threshold voltage (V2), wherein V1>V2;
smoothing sidewalls of the first mask, comprising:
flowing a processing gas into the processing chamber; and
forming the processing gas into an in situ plasma in the processing chamber with sufficient energy to sputter and smooth sidewall roughness of the first mask, wherein a bias voltage between about V1 and V2 is provided during the smoothing the sidewalls; and
etching the etch layer through the first mask.

2. The method, as recited in claim 1, wherein the smoothing sidewalls further comprises providing a chamber pressure of greater than 80 mTorr.

3. The method, as recited in claim 2, wherein the smoothing sidewalls further comprises depositing a deposition on the sidewalls.

4. The method, as recited in claim 3, wherein the depositing the deposition on the sidewalls, comprises:
flowing a deposition gas into the process chamber; and
forming the deposition gas into a plasma.

5. The method, as recited in claim 4, wherein the flowing the processing gas and flowing the deposition gas are performed simultaneously.

6. The method, as recited in claim 4, wherein the flowing the processing gas and flowing the deposition gas are performed sequentially.

7. The method, as recited in claim 4, wherein the flowing the processing gas and flowing the deposition gas are performed cyclically for a plurality of cycles.

8. The method, as recited in claim 4, wherein the processing gas comprises He and the deposition gas comprises $N_2$.

9. The method, as recited in claim 4 wherein the smoothing the sidewalls further comprises providing a bias of at least 25 volts.

10. The method, as recited in claim 1, wherein the smoothing sidewalls further comprises depositing a deposition on the sidewalls.

11. The method, as recited in claim 10, wherein the depositing the deposition on the sidewalls, comprises:
flowing a deposition gas into the process chamber; and
forming the deposition gas into a plasma.

12. The method, as recited in claim 11, wherein the flowing the processing gas and flowing the deposition gas are performed simultaneously.

13. The method, as recited in claim 11, wherein the flowing the processing gas and flowing the deposition gas are performed sequentially.

14. The method, as recited in claim 11, wherein the flowing the processing gas and flowing the deposition gas are performed cyclically for a plurality of cycles.

15. The method, as recited in claim 11, wherein the processing gas comprises He and the deposition gas comprises $N_2$.

16. The method, as recited in claim 1 wherein the smoothing the sidewalls further comprises providing a bias of at least 25 volts.

17. The method, as recited in claim 1, wherein the bias voltage is between V1 and V2.

18. The method, as recited in claim 1, wherein the smoothing the sidewalls selectively sputters away the damaged sidewall surface with respect to the first mask.

* * * * *